(12) United States Patent
Tokunaga et al.

(10) Patent No.: US 7,943,291 B2
(45) Date of Patent: May 17, 2011

(54) CONDUCTIVE FILM-FORMING PHOTOSENSITIVE MATERIAL AND CONDUCTIVE MATERIAL

(75) Inventors: Tsukasa Tokunaga, Minami-ashigara (JP); Akira Ichiki, Minami-ashigara (JP); Yuichi Shirasaki, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 41 days.

(21) Appl. No.: 12/490,815

(22) Filed: Jun. 24, 2009

(65) Prior Publication Data

US 2009/0324902 A1    Dec. 31, 2009

(30) Foreign Application Priority Data

Jun. 25, 2008  (JP) ................................ 2008-165603
Dec. 18, 2008  (JP) ................................ 2008-322424

(51) Int. Cl.
*G03C 1/005*  (2006.01)
*G03C 1/494*  (2006.01)
*G03C 5/00*   (2006.01)
*G03C 1/06*   (2006.01)
*G03C 1/76*   (2006.01)

(52) U.S. Cl. ..................... 430/564; 430/264; 430/270.1; 430/325; 428/195.1

(58) Field of Classification Search .................. 430/264, 430/270.1, 325, 564; 428/195.1
See application file for complete search history.

(56) References Cited

U.S. PATENT DOCUMENTS

| 5,457,019 A | 10/1995 | Nozawa et al. |
| 5,691,109 A | 11/1997 | Kojima et al. |
| 6,346,370 B1 | 2/2002 | Majumdar et al. |
| 2004/0229028 A1 | 11/2004 | Sasaki et al. |
| 2009/0098480 A1* | 4/2009 | Nakahira .................... 430/270.1 |

FOREIGN PATENT DOCUMENTS

| JP | 42-23746 | 11/1942 |
| JP | 10-041682 | 2/1998 |
| JP | 10-340629 | 12/1998 |
| JP | 2000-013088 | 1/2000 |
| JP | 2004-221564 | 8/2004 |
| JP | 2004-221565 | 8/2004 |
| JP | 2006-228649 | 8/2006 |
| JP | 2007-095408 | 4/2007 |
| WO | WO 2006/088026 | 8/2006 |

OTHER PUBLICATIONS

United States Statutory Invention Registration, Reg No. No. H1578, Published Aug. 6, 1996, Taguchi.

* cited by examiner

*Primary Examiner* — Geraldina Visconti
(74) *Attorney, Agent, or Firm* — Young & Thompson

(57) ABSTRACT

A photosensitive material for forming a conductive film having a support, a silver salt-containing emulsion layer over the support, and one or more optional layers formed over the support or the silver salt-containing emulsion layer side of the support, wherein any one of the silver salt-containing emulsion layer or the optional layer(s) contains conductive fine particles and a binder, and the ratio by mass of the conductive fine particles to the binder (the conductive fine particles/the binder) is from 1/33 to 1.5/1.

19 Claims, 1 Drawing Sheet

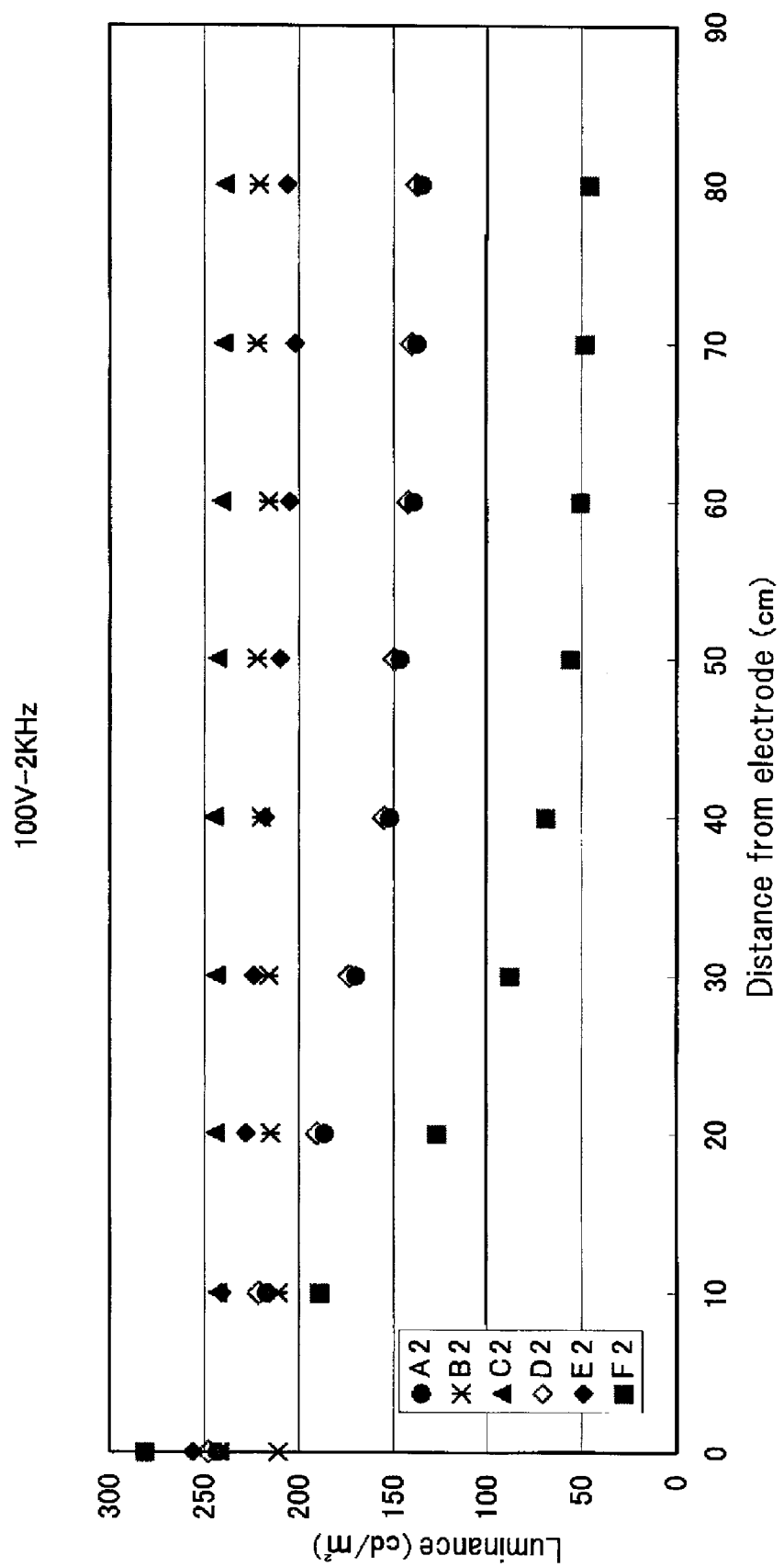

US 7,943,291 B2

CONDUCTIVE FILM-FORMING PHOTOSENSITIVE MATERIAL AND CONDUCTIVE MATERIAL

FIELD OF THE INVENTION

The present invention relates to a photosensitive material for forming a conductive film, and a conductive material obtained therefrom. More specifically, the present invention relates to a photosensitive material for forming a conductive film wherein conductive fine particles and a binder are incorporated into a layer.

BACKGROUND OF THE INVENTION

In recent years, conductive films obtained by various production methods have been investigated (see, for example, JP-A-2000-13088 ("JP-A" means unexamined published Japanese patent application), JP-A-10-340629, JP-A-10-41682, JP-B-42-23746 ("JP-B" means examined Japanese patent publication), and JP-A-2006-228649). One of these films is a silver salt type conductive film produced by painting a silver halide emulsion, and then exposing the resultant patternwise to light so as to give silver conductive regions for conductivity and opening regions for ensuring transparency (see, for example, JP-A-2004-221564, JP-A-2004-221565, and JP-A-2007-95408). About this conductive film, various use purposes have been investigated, and the inventors have been researching the film, paying attention to the use thereof as a planar electrode of an inorganic EL or the like.

SUMMARY OF THE INVENTION

The present invention resides in a photosensitive material for forming a conductive film comprising a support, a silver salt-containing emulsion layer over the support, and one or more optional layers formed over the support or the silver salt-containing emulsion layer side of the support,
wherein any one of the silver salt-containing emulsion layer or the optional layer(s) contains conductive fine particles and a binder, and
wherein the ratio by mass of the conductive fine particles to the binder is from 1/33 to 1.5/1.

Further, the present invention resides in a photosensitive material for forming a conductive film comprising a support, a silver salt-containing emulsion layer over the support, and one or more optional layers formed over the support or the silver salt-containing emulsion layer side of the support,
wherein any one of the silver salt-containing emulsion layer or the optional layer(s) contains conductive fine particles and a binder, and
wherein a content of the conductive fine particles is from 0.05 to 0.9 $g/m^2$.

Further, the present invention resides in a conductive material obtained by exposing the photosensitive material for forming a conductive film described in one of the above items patternwise to light, and then subjecting the materials to developing treatment Further, the present invention resides in a conductive material, comprising a support, a conductive layer over the support, and one or more optional layers formed over the support or the conductive layer side of the support,
wherein any one of the conductive layer or the optional layer(s) contains conductive fine particles and a binder, and
wherein the ratio by mass of the conductive fine particles to the binder is from 1/33 to 1.5/1.

Other and further features and advantages of the invention will appear more fully from the following description, appropriately referring to the accompanying drawings.

BRIEF DESCRIPTION OF THE DRAWINGS

FIG. 1 is a graph showing results obtained by measuring the luminance with respect to distance from the electrode of each sample in Example 2.

DETAILED DESCRIPTION OF THE INVENTION

The inventors have made eager investigations so as to find out that, by incorporating conductive fine particles and a binder into either of a silver salt-containing emulsion layer or a layer on the silver salt-containing emulsion layer side of a support, setting the ratio by mass between the conductive fine particles and the binder (the conductive fine particles/the binder) into a predetermined range, or setting an amount of the conductive fine particles to be contained in a predetermined amount, the conductivity of the resultant conductive material can be raised, and the material is useful as a planar electrode or the like.

In other words, the inventors have found that a conductive material having high conductivity and a photosensitive material for producing the conductive film can be provided by incorporating conductive fine particles and a binder into any layer of a photosensitive material, exposing this material to light, and then developing the material.

According to the present invention, there is provided the following means
(1) A photosensitive material for forming a conductive film comprising a support, a silver salt-containing emulsion layer over the support, and one or more optional layers formed over the support or the silver salt-containing emulsion layer side of the support,
wherein any one of the silver salt-containing emulsion layer or the optional layer(s) contains conductive fine particles and a binder, and
wherein the ratio by mass of the conductive fine particles to the binder (the conductive fine particles/the binder) is from 1/33 to 1.5/1.
(2) The photosensitive material for forming a conductive film described in the above item (1), wherein the ratio by mass of the conductive fine particles to the binder (the conductive fine particles/the binder) is from 1/3 to 1.5/1.
(3) The photosensitive material for forming a conductive film described in the above item (1) or (2), wherein the layer which contains the conductive fine particles and the binder is a layer adjacent to the silver salt-containing emulsion layer.
(4) The photosensitive material for forming a conductive film described in any one of the above items (1) to (3), wherein an amount of the conductive fine particles to be painted is from 0.05 to 0.9 $g/m^2$.
(5) The photosensitive material for forming a conductive film described in the above item (4), wherein the amount of the conductive fine particles to be painted is from 0.2 to 0.4 $g/m^2$.
(6) The photosensitive material for forming a conductive film described in one of the above items (1) to (5), wherein the conductive fine particles are at least one of metal oxides selected from the group of $SnO_2$, $ZnO$, $TiO_2$, $Al_2O_3$, $In_2O_3$, $MgO$, $BaO$ and $MoO_3$; an multiple oxide thereof; or a metal oxide obtained by incorporating a different atom into the said metal oxides or multiple oxide.
(7) The photosensitive material for forming a conductive film described in the above item (6), wherein the conductive fine particles are fine particles of $SnO_2$ doped with antimony.

(8) The photosensitive material for forming a conductive film described in any one of the above items (1) to (5), wherein when the conductive fine particles are spherical, the average particle diameter thereof is from 0.085 to 0.12 μm, and when the conductive fine particles are in a needle form, the average axial length of their long axes (major axes) is from 0.2 to 20 μm, and the average axial length of their short axes (minor axes) is from 0.01 to 0.02 μm.
(9) The photosensitive material for forming a conductive film described in any one of the above items (1) to (6), wherein a protective layer adjacent to the silver salt-containing emulsion layer is laid on the silver salt-containing emulsion layer side of the support, and the protective layer contains conductive fine particles and a binder.
(10) A photosensitive material for forming a conductive film comprising a support, a silver salt-containing emulsion layer over the support, and one or more optional layers formed over the support or the silver salt-containing emulsion layer side of the support,
wherein any one of the silver salt-containing emulsion layer or the optional layer(s) contains conductive fine particles and a binder, and
wherein a content of the conductive fine particles is from 0.05 to 0.9 g/m².
(11) A conductive material obtained by exposing a photosensitive material for forming a conductive film as described in any one of the above items (1) to (10) patternwise to light, and then subjecting the material to developing treatment.
(12) A conductive material, comprising a support, a conductive layer over the support, and one or more optional layers formed over the support or the conductive layer side of the support,
wherein any one of the conductive layer or the optional layer(s) contains conductive fine particles and a binder, and
wherein the ratio by mass of the conductive fine particles to the binder (the conductive fine particles/the binder) is from 1/33 to 1.5/1.
(13) The conductive material described in the above item (12), wherein the ratio by mass of the conductive fine particles to the binder (the conductive fine particles/the binder) is from 1/3 to 1.5/1.
(14) The conductive material described in the above item (12) or (13), wherein an amount of the conductive fine particles to be painted is from 0.05 to 0.9 g/m².
(15) The conductive material described in any one of the above items (12) to (14), wherein a surface resistivity of the conductive layer is from 0.01Ω/□ or more.

In the invention, the "silver salt-containing emulsion layer side (of the support)" denotes a support side opposite to the back face side of the support, i.e., the support side on which at least silver salt-containing emulsion layer is painted. Any "upper layer" on this emulsion layer side means a layer which is nearer to the topmost surface layer (or the topmost layer), which is farther from the support than the emulsion layer, and any "lower layer" on the same side means a layer nearer to the support than the emulsion layer.

The conductive layer is preferably a conductive region in a mesh pattern form.

The photosensitive material for forming a conductive film of the first embodiment of the invention is a conductive-film-forming photosensitive material having a support, a silver salt-containing emulsion layer over the support, and one or more optional layers formed over the support or the silver salt-containing emulsion layer side of the support, wherein any one of the silver salt-containing emulsion layer or the optional layer(s) contains conductive fine particles and a binder, and the ratio by mass of the conductive fine particles to the binder (the conductive fine particles/the binder) is from 1/33 to 1.5/1. The ratio by mass of the conductive fine particles to the binder (the conductive fine particles/the binder) is preferably from 1/3 to 1.5/1. If the ratio by mass of the conductive fine particles to the binder is more than the upper limit, the transparency is insufficient for practical use so that the photosensitive material is unsuitable for a transparent conductive film. If the ratio is less than the lower limit, the in-plane electric characteristics are insufficient. Thus, when the photosensitive material is used for, e.g., an EL element, the brightness thereof is insufficient for practical use.

The photosensitive material for forming a conductive film of the second embodiment of the invention is a conductive-film-forming photosensitive material having a support, a silver salt-containing emulsion layer over the support, and one or more optional layers formed over the support or the silver salt-containing emulsion layer side of the support, wherein any one of the silver salt-containing emulsion layer or the optional layer(s) contains conductive fine particles and a binder, and the content of the conductive fine particles is from 0.05 to 0.9 g/m². The content of the conductive fine particles is preferably from 0.1 to 0.6 g/m², and more preferably from 0.1 to 0.5 g/m². If the content of the conductive fine particles is more than the upper limit, the transparency is insufficient for practical use so that the photosensitive material is unsuitable for a transparent conductive film. If the content of the conductive fine particles is more than the upper limit, it is difficult to disperse the conductive fine particles evenly in the process of painting the conductive fine particles. Thus, production failures tend to increase. In addition, if the content of the conductive fine particles is less than the lower limit, the in-plane electric characteristics is insufficient. Thus, when the photosensitive material is used for, e.g., an EL element, the luminance thereof is insufficient for practical use.

When the layer into which the conductive fine particles are incorporated is the (optional) layer or any one of the (optional) layers on the silver salt-containing emulsion layer side, the layer is not particularly limited in position as far as the layer satisfies the requirement that the layer has electroconductivity to a conductive layer after a conductive material is produced. As the (optional) layers on the silver salt-containing emulsion layer side, a layer adjacent to the silver salt-containing emulsion layer is preferable. The layer adjacent to the silver salt-containing emulsion layer is an upper layer (for example, a protective layer, which will be detailed later) which is over the emulsion layer, or a lower layer (for example, an undercoating layer on the support) which is under the emulsion layer. In the case where the conductive fine particles are incorporated into the upper layer (for example, a protective layer), a more advantageous result for conductivity is obtained when the photosensitive material is used for an electrode or the like. Thus, when the electrode or the like is integrated into an inorganic EL element, the effect of improving the luminance becomes large.

About each of the layers of the photosensitive material for forming a conductive film of the invention, the structure thereof will be described in detail hereinafter.

[Substrate]

A substrate to be employed for the photosensitive material for forming a conductive film of the present invention can be, for example, a plastic film, a plastic plate or a glass plate. The support is preferably a film or plate made of a plastic having a melting point of about 290° C. or lower, such as polyethyleneterephthalate (PET) (melting point: 258° C.), polyethylenenaphthalate (PEN) (melting point: 269° C.), polyethylene (PE) (melting point: 135° C.), polypropylene (PP) (melting point: 163° C.), polystyrene (melting point: 230° C.), polyvinyl chloride (melting point: 180° C.), polyvinylidene chloride (melting point: 212° C.), or triacetyl cellulose (TAC) (melting point: 290° C.). PET is particularly preferred for a translucent film for shielding electromagnetic waves from the viewpoint of light transmittance and workability. As transparency is required to the transparent conductive film, the transparency of the substrate is preferably high.

It is preferred that the above substrate has a transmittance in the entire visible region of 70% or more, more preferably 85% or more, and particularly preferably 90% or more. Further, in the present invention, the substrate may be colored to an extent not hindering the objects of the present invention.

[Silver Salt-Containing Emulsion Layer]

The photosensitive material for forming a conductive film of the present invention has, on the substrate, an emulsion layer containing a silver salt as a photosensor (silver salt-containing layer). The photosensitive emulsion layer containing the silver salt may contain, in addition to the silver salt and a binder, an additive such as a solvent and a dye. The film thickness of the emulsion layer is preferably 0.1 µm to 10 µm, and more preferably 0.1 µm to 5 µm.

In the photosensitive material, the silver salt-containing emulsion layer is substantially laid on the topmost layer. The wording "the silver salt-containing emulsion layer is substantially laid on the topmost layer" means not only a case where the silver salt-containing emulsion layer is actually laid as the topmost layer but also a case where the total film thickness of one or more layers laid on the silver salt-containing emulsion layer is 0.5 µm or less The total film thickness of the layer(s) laid on the silver salt-containing emulsion layer is preferably 0.2 µm or less.

The silver salt to be employed in the present invention can be an inorganic silver salt such as silver halide, and an organic silver salt such as silver acetate. In the present invention, there is preferably employed the silver halide having an excellent property as a photosensor. The amount of the silver salt to be painted in the silver salt-containing emulsion layer is not particularly limited, and it is preferably from 0.5 to 10 g/m$^2$, particularly preferably from 0.5 to 8 g/m$^2$, in terms of silver. When the mount of the silver is too small, it is sometimes difficult to obtain enough conductivity.

The silver halide emulsion to be employed in the present invention may contain a metal belonging to a group VIII or VIIB of the periodic table. Particularly for attaining a high contrast and a low fog level, it is preferable to contain a rhodium compound, an iridium compound, a ruthenium compound, an iron compound or an osmium compound. Such compound can be a compound having various ligands.

Further, for attaining a high sensitivity, there is advantageously employed a doping with a hexacyano metal complex such as $K_4[Fe(CN)_6]$, $K_4[Ru(CN)_6]$, or $K_3[Cr(CN)_6]$.

The rhodium compound can be a water-soluble rhodium compound, of which examples include a rhodium (III) halide, a hexachlororhodium (III) complex salt, a pentachloroaquorhodium complex salt, a tetrachlorodiaquorhodium complex salt, a hexabromorhodium (III) complex salt, a hexaaninerhodium (III) complex salt, a trisalatorhodium (III) complex salt, and $K_3[Rh_2Br_9]$.

Examples the iridium compound include a hexachloroiridium complex salt such as $K_2[IrCl_6]$, and $K_3[IrCl_6]$, a hexabromoiridium complex salt, a hexaammineiridium complex salt, a pentachloroaquonitrosyliridium complex salt.

The amount of the binder to be contained in the emulsion layer is not particularly limited, and can be suitably selected within a range of meeting the dispersibility and the adhesiveness. As for the content of Ag and the binder in the emulsion layer, the ratio by volume of Ag to the binder is preferably 1/10 or more, more preferably 1/4 or more, furthermore preferably 1/2 or more, and particularly preferably 1/1 or more. Moreover, as for the content of Ag and the binder, the ratio by volume of Ag to the binder is preferably 10/1 or less, more preferably 5/1 or less. Using a large amount of the binder may be one of causes to lower the conductivity. Therefore, it is preferable that the amount of the binder is small. The ratio by volume of Ag to the binder may be obtained by converting the ratio by mass of the silver halide to the binder in the starting material (mass ratio) into the ratio by mass of Ag to the binder (mass ratio), and further converting this ratio by mass of Ag to the binder (mass ratio) into the ratio by volume of Ag to the binder (volume ratio).

The emulsion layer may be composed of two or more layers different from or equal to each other in content of Ag.

<Conductive Fine Particles and Binder>

Examples of the conductive fine particles to be employed in the present invention include particles of metal oxide such as $SnO_2$, $ZnO$, $TiO_2$, $Al_2O_3$, $In_2O_3$, $MgO$, $BaO$ and $MoO_3$; particles of an multiple oxide thereof; and particles of a metal oxide obtained by incorporating, into such a metal oxide, a different atom. Preferred example of the different atom includes antimony. Preferred examples of the metal oxide include $SnO_2$, $ZnO$, $TiO_2$, $Al_2O_3$, $In_2O_3$, and $MgO$, and $SnO_2$ is particularly preferred. $SnO_2$ particles are preferably $SnO_2$ particles doped with antimony, in particular preferably $SnO_2$ particles doped with antimony in an amount of 0.2 to 2.0% by mol. The shape of the conductive fine particles to be employed in the present invention is not particularly limited, and examples thereof include granular and needle shapes. The particle diameter of the conductive fine particles is preferably from 0.085 to 0.12 µm. The lower limit of the particle diameter is more preferably 0.09 µm, and even more preferably 0.1 µm. When the requirement for the particle diameter is satisfied, there can be formed a conductive layer excellent in transparency and even in conductivity in the in-plane direction.

The lower limit of the powder resistivity of (a 9.8-MPa green compact of) the conductive fine particles is preferably 0.8 Ωcm, more preferably 1 Ωcm, and even more preferably 4 Ωcm. The upper limit of the powder resistivity of (a 9.8-MPa green compact of) the conductive fine particles is preferably 35 Ωcm, more preferably 20 Ωcm, and even more preferably 10 Ωcm. When the requirement for the powder resistivity is satisfied, a conductive layer even in conductivity in the in-plane direction can be formed.

The specific surface area (according to a simple BET method) is preferably from 60 to 120 m$^2$/g, more preferably from 70 to 100 m$^2$/g. Conductive fine particles satisfying all of the above-mentioned preferred requirements are particularly preferred.

When the conductive fine particles are spherical particles, the average (primary) particle diameter is preferably from 0.085 to 0.12 µm. The powder resistivity is preferably from 0.8 to 7 Ωcm, and more preferably from 1 to 5 Ωcm.

When the particles are needle-form particles, the average axial length of their long axes is preferably from 0.2 to 20 µm and that of their shot axes is from 0.01 to 0.02 µm. The powder resistivity thereof is preferably from 3 to 35 Ωcm, and more preferably from 5 to 30 Ωcm.

As the conductive fine particles having the above-mentioned characteristics, for example, the following may be used: SN series (trade name) manufactured by Ishihara Sangyo Kaisha, Ltd., or a conductive material placed on the market by Mitsubishi Materials Electronic Chemicals Co., Ltd.

Carbon nanotubes and metal nanowires are not included in the conductive fine particles of the present invention.

When the conductive fine particles and the binder are incorporated into the silver salt-containing emulsion layer, the painted amount of the conductive fine particles is preferably from 0.05 to 0.9 g/m$^2$, more preferably from 0.1 to 0.6 g/m$^2$, even more preferably from 0.1 to 0.5 g/m$^2$, and in particular preferably from 0.2 to 0.4 g/m$^2$.

When the conductive fine particles and the binder are incorporated into an upper layer (such as a protective layer), which is over the silver salt-containing emulsion layer, the painted amount of the conductive fine particles is preferably from 0.1 to 0.6 g/m$^2$, more preferably from 0.1 to 0.5 g/m$^2$, and even more preferably from 0.2 to 0.4 g/m$^2$.

When the conductive fine particles and the binder are incorporated into a lower layer (such as an undercoating film), which is under the silver salt-containing emulsion layer, the painted amount of the conductive fine particles is preferably from 0.1 to 0.6 g/m$^2$, more preferably from 0.1 to 0.5 g/m$^2$, and even more preferably from 0.16 to 0.4 g/m$^2$.

If the painted amount of the conductive fine particles is too large, the transparency becomes insufficient for practical use. Thus, the resultant conductive film tends to be unsuitable for a transparent conductive film. Furthermore, if the painted amount of the conductive fine particles is too large, the conductive fine particles are not easily dispersed into an even state in the step of painting the particles. Thus, production failures tend to increase. If the painted amount is too small, the in-plane electric characteristics become insufficient. Thus, when the resultant film is used for an EL element, the luminance tends to become insufficient for practical use.

The layer into which the conductive fine particles and the binder are incorporated is preferably an upper layer over the silver salt-containing emulsion layer side of the support such as a protective layer. In the case where the conductive fine particles are incorporated into the protective layer, favorable conductivity is obtained when the resultant film is used as an electrode or the like. Thus, when the electrode or the like is integrated into an inorganic EL element, the effect of improving the luminance thereof is enhanced.

In the case where the layer into which the conductive fine particles and the binder are incorporated is a protective layer, the painted amount of the conductive fine particles is the same as the above preferable range, but the painted amount of the binder is preferably 0.5 g/m$^2$ or less, more preferably 0.3 g/m$^2$ or less, and furthermore preferably 0.1 g/m$^2$ or less. The lower limit of the painted amount of the binder is preferably 0.001 g/m$^2$. It is preferable that the painted amount of the binder is small, because the conductivity improves according to the decrease of the painted amount of the binder. In the case where the painted amount of the binder is large, the amount of the residual solvent in the coating solution of the binder is large accordingly. Thus, adverse affects to other functional layers may be caused. Therefore, the binder may not be contained in the protect layer. In the case where the amount of the binder is decreased, it is possible to control an unevenness of the conductive fine particles by adjusting the viscosity to 30 cp or more. The viscosity can be appropriately adjusted by controlling the amount of the thickener to be added.

Examples of the thickener include modified cellulose such as methylcellulose, hydroxymethylcellulose, hydroxypropylmethylcellulose, carboxymethylcellulose; polymer compound such as gum arabic, polyvinylpyrrolidone, polyvinylmethylether, polyethylene glycol, polypropylene glycol, copolymer of vinylmethyether and maleic anhydride, copolymer of vinyl acetate and maleic anhydride; vinylarylsulfonic acid such as sodium vinylbenzenesulfonate.

The binder is additionally used for the conductive fine particle-containing layer in order to cause the conductive fine particles closely to adhere onto the support. As such binder, a water-soluble polymer is preferably used.

Examples of the binder include gelatin, carrageenan, polyvinyl alcohol (PVA), polyvinyl pyrrolidone (PVP), polysaccharides such as starch, cellulose and derivatives thereof polyethylene oxide, polysaccharide, polyvinyl amine, chitosan, polylysine, polyacrylic acid, polyalginic acid, polyhyaluronic acid, carboxycellulose, gum arabic, and sodium alginate. These materials have a neutral, anionic or cationic property depending on the ionic property of the functional group.

In the silver salt-containing emulsion layer, a binder is used to disperse the silver salt particles evenly and further aid the adhesion between the emulsion layer and the support, even in the case where the conductive fine particles are not incorporated into the emulsion layer.

<Solvent>

A solvent to be employed in forming the emulsion layer is not particularly limited, and can be, for example, water, an organic solvent (for example, an alcohol such as methanol, a ketone such as acetone, an amide such as formamide, a sulfoxide such as dimethyl sulfoxide, an ester such as ethyl acetate, or an ether), an ionic liquid or a mixture thereof.

The content of the solvent to be used in the emulsion layer of the present invention is in the range of 30 to 90% by mass with respect to the total mass of the silver salt, the binder and the like contained in the emulsion layer, preferably in the range of 50 to 80% by mass.

<Other Additives>

Various additives to be employed in the present invention are not particularly limited, and a known additive can be employed advantageously. Examples thereof include a thickener, an antioxidant, a matting agent, an antistatic agent, a nucleating agent, a spectral sensitizing dye, a surfactant, an antifog agent, a hardener, a black-spot inhibitor. A compound having a high dielectic constant may be added. In order to make the surface hydrophobic, a hydrophobic group(s) may be introduced into the binder, or a hydrophobic compound may be added into the binder.

[Other Layer Structures]

As described above, a protective layer may be formed on the emulsion layer. In the present invention, the "protective layer" means a layer made from a binder such as gelatin or a polymer, and is formed on the emulsion layer having photosensitivity, for the purposes of preventing scratches and improving mechanical characteristics. The thickness of the protective layer is preferably 0.2 μm or less, and more preferably in the range 0.05 μm to 01 μm. A coating method and a forming method for the protective layer is not particularly limited, and a known coating method and forming method can be appropriately selected. Below the silver salt-containing emulsion layer, for example, an undercoating layer may be laid.

In the present invention, it is allowable to lay an optional layer other than the silver-salt-containing emulsion layer, and incorporate the conductive fine particles and the binder into the layer. The optional layer may be an upper layer or lower layer, which is over or under the silver-salt-containing emulsion layer, respectively. It is also preferred to incorporate the conductive fine particles and the binder into a layer adjacent to the silver-salt-containing emulsion layer.

Examples of the layer structure of the photosensitive material of the invention, in which the conductive fine particle-containing layer is laid independently from the protective layer or undercoating layer, include the following layer structures, which will each be described in the order from a layer nearest to the support toward a layer farthest thereto: (1) undercoating layer/emulsion layer/conductive fine particle-containing layer/protective layer or adhesion imparting layer which contains silica, (2) undercoating layer/emulsion layer/conductive fine particle-containing layer, (3) conductive fine particle-containing layer/emulsion layer/protective layer, and (4) undercoating layer/first emulsion layer/second emulsion layer/conductive fine particle-containing layer/protective layer. The layer structure may be a structure wherein the conductive fine particle-containing layer is the topmost layer without forming any protective layer.

The above photosensitive material may be formed, on a substrate, by simultaneous-multi-layer coating of coating solutions capable of forming various layers. Examples of the coating solutions include a coating solution for forming the emulsion layer, a coating solution for forming the conductive fine particle-containing layer, and the like. The conductive film can be produced by such a simultaneous-multi-layer coating and by subjecting the resultant to exposure and developing treatments described later. This enables to simplify production process and improve process yield. In the case where a coating solution for the conductive fine particle-containing layer is painted on a conductive film in a mesh pattern, it sometimes causes problems such as agglomeration of the conductive fine particles on the mesh due to inhomogeneous dispersion of the conductive fine particles. However, by using simultaneous-multi-layer coating, a conductive film having high dispersibility of the conductive fine particles can be obtained without causing the above problem.

[Conductive Film (Conductive Material)]

The conductive film of the invention is a conductive film having a support, a conductive layer over the support, and one or more optional layers formed over the support or the conductive layer side of the support, wherein any one of the conductive layer or the optional layer(s) contains conductive fine particles and a binder, and the ratio by mass of the conductive fine particles to the binder (the conductive fine particles/the binder) is from 1/33 to 1.5/1. The ratio by mass of the conductive fine particles to the binder (the conductive fine particles/the binder) is preferably from 1/3 to 1.5/1.

The conductive material of the invention is preferably a material obtained by exposing the above-mentioned photosensitive material for forming a conductive film patternwise to light, and then subjecting the exposed material to developing treatment. However, the material is not limited thereto. In other words, it is sufficient for the invention that the conductive film of the invention is any film wherein any one of a conductive layer (first conductive layer) and one or more optional layers formed on the conductive layer side of a support contains conductive fine particles and a binder, the film having the second conductive layer (any layer of the conductive layer side containing the conductive fine particles and a binder such as a protective layer or undercoating layer as described above) in which the ratio by mass of the conductive fine particles to the binder is from 1/33 to 1.5/1. Examples of the first conductive layer include a layer having a copper foil mesh pattern, a layer having a mesh pattern formed in a printing way, a layer containing a conductive polymer, a layer containing conductive fine particles different from the conductive fine particles contained in the second conductive layer, and a layer made of ITO.

In the conductive film of the invention, the overall-ray transmittance is preferably 81% or more, more preferably 82% or more, even more preferably 83% or more, even more preferably 84% or more, in particular preferably 85% or more, and most preferably 90% or more. In the conductive film of the invention, the transmittance of its openings, which do not contain any mesh pattern region, is preferably 81% or more, more preferably 82% or more, even more preferably 83% or more, even more preferably 84% or more, in particular preferably 85% or more, and most preferably 90% or more. When metallic particles such as silver particles or copper particles are used as the conductive fine particles, the transmittance of the openings lowers so that the transparency may become insufficient for practical use. In the conductive film of the invention, it is preferred from the viewpoint of the transparency thereof to use conductive fine particles made of one or more selected from the above-mentioned metal oxides and multiple oxides thereof.

The second conductive layer in the conductive material of the invention may have the same structure as in the photosensitive material for forming a conductive film of the invention.

The first conductive layer and the second conductive layer in the conductive material of the invention preferably satisfy relationships described below. When the relationships are satisfied, the in-plane electric characteristics of the conductive material become evener. Thus, when the material is made into an inorganic EL element, a sufficient luminance can be obtained in the whole of its plane.

(1) The surface resistivity of the first conductive layer is smaller than that of the second conductive layer.

(2) The surface resistivity of the first conductive layer is 200 $\Omega$/sq or less (and 0.01 $\Omega$/sq or more), and that of the second conductive layer is $1\times10^3$ $\Omega$/sq or more (and $1\times10^{14}$ $\Omega$/sq or less).

The upper limit of the surface resistivity of the first conductive layer is more preferably 150 $\Omega$/sq. The lower limit of the surface resistivity of the first conductive layer is more preferably 0.1 $\Omega$/sq, and in particular preferably 1 $\Omega$/sq.

The upper limit of the surface resistivity of the second conductive layer (conductive fine particle-containing layer) is more preferably $1\times10^{13}$ $\Omega$/sq. The lower limit of the surface resistivity of the second conductive layer is more preferably $1\times10^5$ $\Omega$/sq, and in particular preferably $1\times10^6$ $\Omega$/sq.

In the invention, the surface resistivity may be measured with resistivity meter for low resistivity Loresta GP (trade name, manufactured by Mitsubishi Chemical Corporation), non-contact conductance monitor MODEL 717B (trade name, manufactured by DELCOM Instruments, Inc.), or a digital ultra high resistance/microammeter 8340A (trade name, manufactured by ADC Corporation).

It is also preferred that the content of the conductive fine particles in the second conductive layer is adjusted in accordance with the surface resistivity of the first conductive layer.

When the surface resistivity of the first conductive layer is from 0.01 to 50 $\Omega$/sq (the first conductive layer is, for example, a developed silver mesh pattern), the ratio by mass of the conductive fine particles to the binder (the conductive fine particles/the binder) is preferably from 1/3 to 1.5/1.

When the surface resistivity of the first conductive layer is from 70 to 200 $\Omega$/sq (the first conductive layer is, for example, an ITO layer), the ratio by mass of the conductive fine particles to the binder (the conductive fine particles/the binder) is preferably from 1/33 to 1/1.

The following will describe, in detail, embodiments of a conductive film obtained by exposing the photosensitive material for forming a conductive film of the invention patternwise to light, and then subjecting the exposed material to developing treatment.

In the invention, the photosensitive-material-form made by the pattern exposure and the developing treatment may be a mesh form, examples of which include a lattice form, in which straight lines cross each other at right angles, and a wavy line form, which has, between its crossing portions, at least a curve. For example, about the lattice-form mesh, the width of lines and that of spaces are each preferably from 20 to 1000 μm, and more preferably from 20 to 300 μm. In this case, the pitch thereof is preferably from 200 to 1000 μm, and more preferably from 200 to 600 μm.

In the invention, an additional conductive layer may be formed by painting a conductive polymer as far as the conductivity is ensured.

[Exposure]

A pattern exposure of the silver salt-containing layer can be performed by a planar exposure utilizing a photomask, or by a scanning exposure with a laser beam. A refractive exposure employing a lens or a reflective exposure employing a reflecting mirror may be employed, and there can be utilized a contact exposure, a proximity exposure, a reduced projection exposure or a reflective projection exposure.

[Developing Treatment]

In the photosensitive material of the present invention, a developing treatment is further performed after the exposure of the silver salt-containing layer. The above-mentioned developing treatment can be performed with an ordinary developing technology employed, for example, in a silver halide photographic film, printing paper, films for making printing-plates, and emulsion masks for photomasks.

In the invention, the exposure and the developing treatment are conducted, thereby forming a pattern-form metallic silver region in an exposed portion and further forming a light transmissible region described below in an unexposed portion.

The developing treatment of the photosensitive material of the present invention may include a fixing treatment conducted to remove the silver salt in the unexposed portion and attain stabilization. In the fixing treatment in the producing method of the present invention, there may be used any technique of the fixing treatment used for silver salt photographic films, printing paper, films for making printing-plates, emulsion masks for photomasks, and others.

In the case where the silver-salt-containing emulsion layer contains the conductive fine particles, with respect to the thus-obtained conductive material of the invention, the conductive fine particles are dispersed in a light transmissible region, from which the silver salt has dropped out, so that a conductive layer having a higher resistivity than the metallic silver region is formed. When any layer other than the silver-salt-containing emulsion layer contains the conductive fine particles, a conductive layer having a light transmissible region wherein the conductive fine particles are dispersed is formed in the same manner.

For the above-mentioned photosensitive material and conductive material of the invention, any appropriate combination of two or more selected from known documents listed up below may be used.

JP-A-2004-221564, JP-A-2004-221565, JP-A-2007-200922, JP-A-2006-352073, pamphlet of WO2006/001461A1, JP-A-2007-129205, JP-A-2007-235115, JP-A-2007-207987, JP-A-2006-012935, JP-A-2006-010795, JP-A-2006-228469, JP-A-2006-332459, JP-A-2007-207987, JP-A-2007-226215, pamphlet of WO2006/088059A1, JP-A-2006-261315, JP-A-2007-072171, JP-A-2007-102200, JP-A-2006-228473, JP-A-2006-269795, JP-A-2006-267635, JP-A-2006-267627, pamphlet of WO2006/098333, JP-A-2006-324203, JP-A-2006-228478, JP-A-2006-228836, JP-A-2006-228480, pamphlet of WO2006/098336A1, pamphlet of WO2006/098338A1, JP-A-2007-009326, JP-A-2006-336057, JP-A-2006-339287, JP-A-2006-336090, JP-A-2006-336099, JP-A-2007-039738, JP-A-2007-039739, JP-A-2007-039740, JP-A-2007-002296, JP-A-2007-084886, JP-A-2007-092146, JP-A-2007-162118, JP-A-2007-200872, JP-A-2007-197809, JP-A-2007-270353, JP-A-2007-308761, JP-A-2006-286410, JP-A-2006-283133, JP-A-2006-283137, JP-A-2006-348351, JP-A-2007-270321, JP-A-2007-270322, pamphlet of WO2006/098335A1, JP-A-2007-088218, JP-A-2007-201378, JP-A-2007-335729, pamphlet of WO2006/098334A1, JP-A-2007-134439, JP-A-2007-149760, JP-A-2007-208133, JP-A-2007-178915, JP-A-2007-334325, JP-A-2007-310091, JP-A-2007-311646, JP-A-2007-013130, JP-A-2006-339526, JP-A-2007-116137, JP-A-2007-088219, JP-A-2007-207883, JP-A-2007-207893, JP-A-2007-207910, JP-A-2007-013130, pamphlet of WO2007/001008, JP-A-2005-302508, and JP-A-2005-197234.

Dispersive electroluminescent elements are driven by alternating current. Typically, the elements are driven by use of an AC power 100 V in voltage and from 50 to 400 Hz in frequency. When the area thereof is small, the luminance increases approximately in proportion to applied voltage and frequency. However, in the case of any large-area element having an area of 0.25 $m^2$ or more, the capacity component of the element increases so that the impedance matching between the element and the power source is lost or the time constant necessary for storing electric charges into the element becomes large. For this reason, the element easily turns into a state that the element does not receive sufficient supply of power even when the voltage and frequency supplied thereto are made high, in particular, even when the frequency is made high. In the case where, in particular, elements having an area of 0.25 $m^2$ or more are driven by AC having a frequency of 500 Hz or more, the voltage applied thereto is often lowered in accordance with an increase in the driving frequency. As a result, a fall in the luminance is often caused.

On the other hand, the electroluminescent element wherein the conductive material of the invention is used as an electrode can be driven by a high-frequency power even when the size of the element is as large as 0.25 $m^2$ or more. As a result, a high luminance can be given. In this case, a driving power having a frequency of 500 Hz or more and 5 kHz or less is preferred and a driving power having a frequency of 800 Hz or more and 3 kHz or less is more preferred.

The present invention can provide a conductive material having high conductivity, and a photosensitive material for producing the conductive film.

When the photosensitive material for forming a conductive film of the invention is used, a conductive film having a high conductivity can be produced at low cost, without being subjected to any plating treatment, by exposing the material patternwise to light and then subjecting the exposed material to developing treatment. In particular, a conductive material having a high conductivity and transparency can be produced at low cost. This technique has a particularly large advantage that the conductive material can be painted by batch processing such as a simultaneous multi-layer coating of conductive fine particles, without painting the conductive fine particles by overcoating after the developing treatment.

The conductive material obtained by the use of the photosensitive material of the invention can widely be applied, as a conductive film, to a liquid crystal television, a plasma television, an organic EL, an inorganic EL, a solar cell, a touch panel, a printed circuit board and so on. The invention can also be applied to a pen-inputting type touch panel, which is required to have a high precision, so as to give such an excellent linearity that data such as characters can be input without interruption. The conductive film produced by the use of the photosensitive material for forming a conductive film of the invention is low in resistivity, and can be used as an electromagnetic wave shielding material or the like. When the conductive film has translucency, the film is useful as a translucent, electromagnetic wave shielding film, a transparent heat-generating film, or the like.

The present invention will be described in more detail based on the following examples, but the invention is not intended to be limited thereto. In the following Examples, the terms "part" and "%" are values by mass, unless they are indicated differently in particular.

EXAMPLES

Example 1

(Preparation of Emulsion A)

Solution 1:

| | |
|---|---|
| Water | 750 ml |
| Gelatin (phthalation-treated gelatin) | 8 g |
| Sodium chloride | 3 g |
| 1,3-Dimethylimidazolidine-2-thione | 20 mg |
| Sodium benzenethiosulfonate | 10 mg |
| Citric acid | 0.7 g |

Solution 2:

| | |
|---|---|
| Water | 00 ml |
| Silver nitrate | 150 g |

Solution 3:

| | |
|---|---|
| Water | 300 ml |
| Sodium chloride | 38 g |
| Potassium bromide | 32 g |
| Potassium hexachloroiridate (III) (0.005% in 20% aqueous KCl solution) | 5 ml |
| Ammonium hexachlororhodate (0.001% in 20% aqueous NaCl solution) | 7 ml |

The potassium hexachloroiridate (III) (0.005% in 20% aqueous KCl solution) and ammonium hexachlororhodate (0.001% in 20% aqueous NaCl solution) used in Solution 3 were prepared by dissolving powders thereof in a 20% aqueous solution of KCl and a 20% aqueous solution of NaCl respectively and heating the solutions at 40° C. for 120 minutes.

To solution 1, while the temperature and the pH of which were kept at 38° C. and 4.5, respectively, solutions 2 and 3 (amounts corresponding to 90% of the respective solution amounts) were added simultaneously over a period of 20 minutes with being stirred. In this way, nucleus particles 0.16 μm in size were formed. Subsequently, the following solutions 4 and 5 were added thereto over a period of 8 minutes, and the rests of the solutions 2 and 3 (amounts corresponding to 10% of the respective solution amounts) were further added thereto over a period of 2 minutes so as to cause the particles to grow up to 0.21 μm in size. Furthermore, 0.15 g of potassium iodide was added thereto, and the resultant was aged for 5 minutes to end the formation of the particles.

Solution 4:

| | |
|---|---|
| Water | 100 ml |
| Silver nitrate | 50 g |

Solution 5:

| | |
|---|---|
| Water | 100 ml |
| Sodium chloride | 13 g |
| Potassium bromide | 11 g |
| Potassium ferrocyanide | 5 mg |

Thereafter, washing with water by the flocculation method according to the ordinary method was conducted. Specifically, the temperature was lowered to 35° C., and the pH was lowered using sulfuric acid until the silver halide precipitated (the pH was in the range of 3.2±0.2).

About 3 L of the supernatant was then removed (first water washing). Further, 3 L of distilled water was added to the mixture, and sulfuric acid was added until silver halide precipitated. 3 L of the supernatant was again removed (second water washing). The procedure same as the second water washing was repeated once more (third water washing), and water-washing and desalting steps were thus completed.

The emulsion after the water-washing and desalting was adjusted to the pH of 6.4 and the pAg of 7.5. Thereto, 10 mg of sodium benzenethiosulfonate, 3 mg of sodium benzenethiosulfinate, 15 mg of sodium thiosulfate, and 10 mg of chloroauric acid were added, and the mixture was thus subjected to chemical sensitization to obtain the optimal sensitivity at 55° C. Then, 100 mg of 1,3,3a,7-tetrazaindene as a stabilizing agent, and 100 mg of Proxel (trade name, manufactured by ICI Co., Ltd.) as an antiseptic were added. Finally, a silver iodochlorobromide cubic particle emulsion containing 70 mol % of silver chloride and 0.08 mol % of silver iodide and having an average particle diameter of 0.22 μm and a coefficient of variation of 9% was obtained. The emulsion had finally a pH of 6.4, a pAg of 7.5, an electrical conductivity of 40 μS/m, a density of $1.2 \times 10$ kg/m$^3$, and a viscosity of 60 mPa·s.

(Preparation of Coating Sample)

To the above-described Emulsion A, 5 $7 \times 10^{-4}$ mol/mol Ag of a sensitizing dye (SD-1) was added so as to carry out spectral sensitization. Furthermore, $3.4 \times 10^{-4}$ mol/mol Ag of KBr and $8.0 \times 10^{-4}$ mol/mol Ag of Compound (Cpd-3) were added thereto and mixed enough.

Subsequently, $1.2 \times 10^{-4}$ mol/mol Ag of 1,3,3a,7-tetrazaindene, $1.2 \times 10^{-2}$ mol/mol Ag of hydroquinone, $3.0 \times 10^{-4}$ mol/mol Ag of citric acid, 90 mg/m$^2$ of sodium 2,4-dichloro-6-hydroxy-1,3,5-triazine, 15% by mass relative to the gelatin of colloidal silica having a particle size of 10 μm, 50 mg/m$^2$ of aqueous latex (aqL-6), 100 mg/m$^2$ of a polyethylacrylate latex, 100 mg/m$^2$ of a latex copolymer of methyl acrylate, sodium 2-acrylamide-2-methylpropanesulfonate, and 2-acetoxyethyl methacrylate (ratio by mass 88:5:7), 100 mg/m$^2$ of a core-shell type latex (core: styrene/butadiene copolymer (ratio by mass 37/63), shell: styrene/2-acetoxyethyl acrylate (ratio by mass 84/16), core/shell ratio=50/50), and a compound (Cpd-7) (4% by mass of relative to the gelatin) were added to the mixture, and the pH of the coating solution so obtained was adjusted to 5.6 using citric acid.

(Undercoating Layer)

An undercoating layer was formed on a support (made of polyethylene terephthalate (PET) subjected beforehand to surface hydrophilicity-imparting treatment and having a thickness of 100 μm) as described below.

As an undercoating layer for Emulsion A layer that would be formed as described below, a layer satisfying the following conditions was formed. The amount of gelatin in Solution 1 of Emulsion A: 20 g, the ratio by volume of Ag to the binder (ratio by volume of Ag/GEL) in the emulsion layer: 1.0/0.9, content of silver: 1.0 g/m$^2$ and the painted amount gelatin: 0.11 g/m$^2$.

(Silver Halide Emulsion Layer)

Emulsion A was used to paint the emulsion layer coating solution prepared as described above on the undercoating layer to set the painted amounts of Ag and gelatin to 4.5 g/m$^2$ and 0.25 g/m$^2$, respectively.

(Protective Layer)

A protective layer was formed by painting the following Solution 1 in an amount of 20 ml/m$^2$ onto the above silver halide emulsion layer.

| Solution 1: | |
| --- | --- |
| Water | 943 ml |
| Gelatin | 33 g |
| Sb-doped tin oxide (trade name: SN100P, manufactured by Ishihara Sangyo Kaisha, Ltd.) | 20 g |

Furthermore, a surfactant, a preservative, and a pH adjustor were appropriately added thereto.

The thus-obtained coating product was dried. The resultant was named Sample A.

In Sample A, the conductive fine particles were painted onto the protective layer in a painted mount of 0.4 g/m$^2$ and at a ratio by mass of the conductive fine particles to the binder of 0.6/1. In order to examine the resistivity of the conductive fine particles alone (the conductive film resistivity), this coating sample, Sample A was subjected only to fixing treatment without being subjected to exposing/developing treatment, so as to remove the silver halide. Thereafter, the surface resistivity was measured. As a result, it was $10^7 \Omega/\square$. The surface resistivity (unit: $\Omega/\square$) was measured with a digital ultra high resistance/microammeter 8340A (trade name, manufactured by ADC Corporation).

A coating sample, Sample B was obtained in the same way as Sample A except that the amount of Sb-doped tin oxide in the protective layer was changed. In Sample B, the painted amount of the conductive fine particles was 0.22 g/m$^2$, and the ratio by mass of the conductive fine particles to the binder was 1.2/1. This painted film was subjected only to fixing treatment without being subjected to developing treatment, so as to remove the silver halide. The surface resistivity was then measured. As a result, it was $10^9 \Omega/\square$.

Sample C was obtained in the same way except that tin oxide was removed from the protective layer, tin oxide was added to the emulsion in the undercoating layer to give a painted amount of 0.3 g/m$^2$, and then resultant was dried. The ratio of the conductive fine particles to the binder in the undercoating layer was 1.48/1. This painted film was subjected only to fixing treatment without being subjected to developing treatment, so as to remove the silver halide. The surface resistivity was then measured. As a result, it was $10^{12} \Omega/\square$.

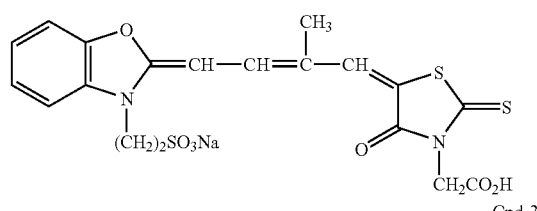

SD-1

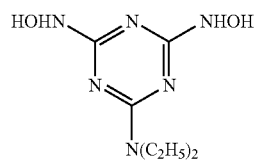

Cpd-3

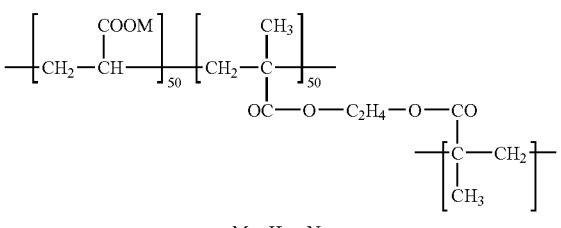

M = H or Na aqL-6

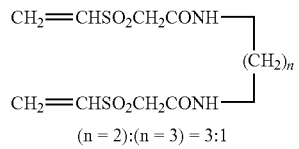

(n = 2):(n = 3) = 3:1

Cpd-7

(Exposing/Developing Treatments)

Next, Samples A to C prepared in the above were each exposed to parallel light from a high-pressure mercury lamp as a light source through a lattice-form photomask capable of giving a developed silver image wherein lines and spaces were 5 µm and 295 µm, respectively (a photomask wherein lines and spaces were 295 µm and 5 µm (pitch: 300 µm), respectively, and the spaces were in a lattice form). The resultant was developed with the following developing solution, subjected further to developing treatment by use of a fixing solution (trade name: N3X-R for CN16X, manufactured by Fuji Photo Film Co., Ltd.), and rinsed with pure water. In this way, Samples A to C were obtained

[Composition of Developing Solution]

1 liter of the developing solution contains the following compounds:

| | |
| --- | --- |
| Hydroquinone | 0.037 mol/L |
| N-Methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Calendering Treatment)

The samples subjected to the developing treatment as described above were calendered. The used calendering rolls were metallic rolls (each made of an iron core and hard chromium plating, roll diameter: 250 m) While a linear pressure of 400 kgf/cm was applied thereto, the samples were each passed between the rollers to measure the surface resistivity (unit: ohm(s)/sq, or $\Omega/\square$).

Samples A, B and C were calendered at a pressure of 400 kgf/cm. Samples A, B and C subjected to no calendering treatment were named Samples D, E and F, respectively.

(Examples for Comparison)

Silver halide emulsion coating products (manufactured by Fuji Photo Film Co., Ltd.) were each developed to give lines 10 μm in width and space 295 μm in width. One of the resultant samples had a surface resistivity of 30Ω/□, and another of the resultant samples was further plated to set the surface resistivity thereof to 0.4Ω/□. Onto the former and latter samples, a conductive polymer (trade name: Baytron PEDOT, polyethylene dioxythiophene manufactured by TA Chemical Co.) was painted into a mesh form, so as to prepare Samples G and H, respectively, as examples for comparison. The same conductive polymer was painted onto a PET base, and the resistivity of the polymer alone was measured. The resistivity was $10^6$ Ω/□.

The same developing and plating treatments as for Sample H were conducted. The resultant, onto which no material was painted after the plating treatment, was named Sample I.

In order to compare the invention with a conventionally used technique giving the highest conductivity and the highest light transmittance, ITO films were used to form mesh patterns each having lines 10 μm in width and space 295 μm in width. In this way, samples were prepared. These samples were named Samples J and K as examples for comparison. The samples J and K were different only in resistivity, and had a resistivity of 20Ω/□ and that of 80Ω/□, respectively.

(Preparation of Electroluminescent Elements)

Samples A to K produced as described above were each integrated into a dispersive inorganic EL (electroluminescent) element to make a light emission test as described below.

A reflective insulating layer coating solution which contained a pigment having an average particle diameter of 0.03 μm and a light emitting layer coating solution which contained fluorescent particles having an average particle diameter of 50 to 60 μm were painted onto an aluminum sheet which was to be a backside electrode, and then a hot wind drier was used to dry the whole at 110° C. for 1 hour.

Thereafter, samples A to K were each stacked onto the surface of the fluorescent-particle layer and the dielectric layer on the backside electrode. The stacked members were thermally compressed to form an EL element. The element was sandwiched between two sheets of water-absorbent sheet made of nylon 6 and two sheets of moisture-proof film. The integrated members were thermally compressed. The EL element was 3 cm×5 cm in size.

(Evaluation)

The power source used to measure the light-emitting luminance was a constant-frequency constant-voltage power source CVFT-D series (trade name, manufactured by Tokyo Seiden Co., Ltd.). For the measurement of the luminance (unit: cd/m$^2$), luminance meter BM-9 (trade name, manufactured by Topcon Technohouse Corp.) was used.

(Results)

Each of the inorganic EL elements was driven by a power having a peak voltage of 100 V, a frequency of 1000 Hz or 2000 Hz, and the luminance thereof was measured. The results are shown in Table 1.

TABLE 1

| Sample | Surface resistivity (Ω/□) | Resistivity of conductive-fine-particle-containing conductive film (Ω/□) | Transparency | Luminance (1 kHz) (cd/m$^2$) | Luminance (2 kHz) (cd/m$^2$) | Remarks |
|---|---|---|---|---|---|---|
| A | 8 | $10^7$ | 83.29 | 152 | 238 | This invention |
| B | 8 | $10^9$ | 84.09 | 154 | 245 | This invention |
| C | 8 | $10^{12}$ | 84.7 | 162 | 264 | This invention |
| D | 16 | $10^7$ | 84 | 153 | 237 | This invention |
| E | 16 | $10^9$ | 83.9 | 154 | 243 | This invention |
| F | 16 | $10^{12}$ | 84.6 | 162 | 265 | This invention |
| G | 30 | $10^6$ | 83.56 | 148 | 232 | Comparative example |
| H | 0.4 | $10^6$ | 80.02 | 123 | 184 | Comparative example |
| I | 0.4 | x | 81 | 30 | 50 | Comparative example |
| J | 20 | x | 81.88 | 142 | 224 | Comparative example |
| K | 80 | x | 85 | 178 | 267 | Comparative example |

Note
"x" denotes that it was impossible to measure any property because no conductive layer was formed.

In Table 2, the structures of the individual sample are also shown in a compactly-arranged form.

TABLE 2

| Sample | Conductive fine particles | Layer which contains conductive fine particles | Content (g/m$^2$) | Conductive fine particles/Binder (Ratio By Mass) | Calendering treatment | Remarks |
|---|---|---|---|---|---|---|
| A | Sb-doped tin oxide | protective layer | 0.4 | 0.6/1 (1/1.67) | performed | This invention |
| B | Sb-doped tin oxide | protective layer | 0.22 | 1.2/1 | performed | This invention |
| C | Sb-doped tin oxide | undercoating layer | 0.3 | 1.48/1 | performed | This invention |
| D | Sb-doped tin oxide | protective layer | 0.4 | 0.6/1 | none | This invention |
| E | Sb-doped tin oxide | protective layer | 0.22 | 1.2/1 | none | This invention |
| F | Sb-doped tin oxide | undercoating layer | 0.3 | 1.48/1 | none | This invention |
| G | None | A layer containing a conductive polymer was formed on a mesh pattern of developed silver. | | | | Comparative example |

TABLE 2-continued

| Sample | Conductive fine particles | Layer which contains conductive fine particles | Content (g/m²) | Conductive fine particles/ Binder (Ratio By Mass) | Calendering treatment | Remarks |
|---|---|---|---|---|---|---|
| H | None | A layer containing a conductive polymer was formed on a mesh pattern of developed silver. | | | | Comparative example |
| I | None | A layer containing a conductive polymer was not formed on a mesh pattern of developed silver. | | | | Comparative example |
| J | None | A layer containing a conductive polymer was not formed on a mesh pattern of developed silver. | | | | Comparative example |
| K | None | A layer containing a conductive polymer was not formed on a mesh pattern of developed silver. | | | | Comparative example |

In Samples A to F of the invention examples, the surface resistivity of the conductive film in the mesh openings was as high as $10^7 \Omega/\square$ or more. Notwithstanding this fact, the luminance was not lowered and the openings also brightened. Although the resistivity of the mesh made of the silver halide was $8\Omega/\square$ or $16\Omega/\square$, the luminance was hardly affected. On the other hand, Samples G and H of example for comparison each emitted light from the entire surface thereof. The luminance thereof was substantially equal to that of Samples A and G, the transmittance of which was equal to that of Samples G and H. However, Sample G had a problem that the number of processes increased part y because the polymer was given thereto after the formation of the mesh. In Samples B and C, the surface resistivity of the conductive film in their mesh openings was high. Notwithstanding this fact, a high luminance was obtained. Thus, it was ascertained that the present invention was superior to the examples for comparison.

In Sample I, wherein no conductive film was imparted, only the vicinity of the mesh brightened.

In Sample J of example for comparison, the luminance was low. In Sample K, the luminance was high: however, the sample had a problem that the luminance is lowered, as will be described in Example 2, when the sample is made into a long form.

In the samples of the invention, transparency sufficient for practical use was exhibited, and the conductive fine particles were succeeded in being evenly dispersed in the painting process of the conductive fine particles. Thus, production failures were hardly generated. On the other hand, when the painted amount of the conductive fine particles was out of the scope specified in the invention, for example, 3 g/m², it took much time to disperse the particles in the production of the coating solution. Furthermore, production failures increased in the painting process.

Example 2

Next, in the same way as the samples prepared in Example 1, Samples A2, B2 and C2 were prepared wherein the mesh surface resistivities of the silver halide emulsion were 30, 16, and $8\Omega/\square$, respectively. Conductive fine particles were given to their protective layers, so that the surface resistivities of the conductive fine particle-containing (tin-oxide-containing) conductive film alone in the openings were each $10^9 \Omega/\square$.

As an example for comparison, a silver mesh having a surface resistivity of $30\Omega/\square$ was prepared from a silver halide emulsion coating product, and then a conductive polymer (Pedot described above) was given to its openings to produce Sample D2 having a single-film resistivity of $10^6 \Omega/\square$. Furthermore, in order to compare the invention with a conventionally used technique giving the highest conductivity and the highest light transmittance, ITO films were used to produce samples. These samples were named Samples E2 and F2 as examples for comparison. The samples E2 and F2 were different only in resistivity, and had a resistivity of $20\Omega/\square$ and that of $80\Omega/\square$, respectively.

As the above-mentioned samples, samples 14 cm in width and 85 cm in length were actually prepared. The samples were driven by a power having a peak voltage of 100 V and a frequency of 1.4 kHz. A leading-out electrode was set to a bus bar, which was made of Ag paste, of each of the samples, and then the luminance was measured while the distance of a point to be measured from the leading-out electrode was changed. The distance of the measurement point from the bus bar was set to 5 mm, 100 mm, 200 mm, 300 mm, 400 mm, 500 mm, 600 mm, 700 mm, and 800 mm, respectively.

The measurement results are shown in FIG. 1.

It is understood from the results that the luminance decreased, in Samples E2 and F2 for comparison wherein the ITO films were used, as the distance from the electrode increased. On the other hand, it is understood that light was emitted without decreasing the luminance, in Sample C2 of the invention example, although the distance from the electrode increased. Sample B2, wherein the mesh resistivity was $16\Omega/\square$, gave luminance substantially equal to that of Sample E, wherein the ITO surface resistivity was $20\Omega/\square$. However, the invention example is better than the examples for comparison since ITO having a surface resistivity of $20\Omega/\square$ is a material which is expensive and may be depleted.

Sample D2, wherein the conductive film was imparted after the formation of the mesh, gave luminance equal to that of sample A. However, as described in Example 1, the number of the producing processes increased since the conductive film was imparted after the formation of the mesh. Therefore, it can be ascertained that the invention is superior.

Example 3

Samples 3-1 to 3-3 were obtained in the same way as in Example 1 except that the conductive layer made of the developed Ag mesh in Sample A of Example 1 was changed to a conductive layer made of ITO, and the amount of the conductive fine particles contained in the protective layer and the ratio by mass of the conductive fine particles to the binder were changed as shown in Table 3. Samples 3-1 to 3-3 each had a lattice pattern having lines 5 µm in width and spaces 295 µm in width. In the same way as Sample A of Example 1, the resultant samples were each integrated into a dispersive inorganic EL element, and then subjected to a light emission test, so as to be evaluated. The obtained results are shown in Table 4. About Samples 3-1 to 3-3, the luminance was measured while the distance of a point to be measured from their electrode was changed in the same ways as in Example 2. As a result, it was understood that even the points having distances of 20 cm, 30 cm and 40 cm, respectively, from the electrode gave luminance sufficient for practical use.

subjected to a light emission test, so as to be evaluated. The obtained results are shown in Table-6. As a result, it was understood that those samples gave luminance sufficient for

TABLE 3

| Sample | Conductive layer | Conductive fine particles | Layer which contains conductive fine particles | Content (g/m$^2$) | Conductive fine particles/Binder (Ratio By Mass) | Remarks |
|---|---|---|---|---|---|---|
| 3-1 | ITO | Sb-doped tin oxide | protective layer | 0.05 | 1/33 | This invention |
| 3-2 | ITO | Sb-doped tin oxide | protective layer | 0.29 | 1/5 | This invention |
| 3-3 | ITO | Sb-doped tin oxide | protective layer | 0.86 | 1/1 | This invention |

TABLE 4

| Sample | Surface resistivity (Ω/□) | Resistivity of conductive-fine-particle-containing conductivefilm (Ω/□) | Transparency | Luminance (1 kHz) (cd/m$^2$) | Luminance (2 kHz) (cd/m$^2$) | Remarks |
|---|---|---|---|---|---|---|
| 3-1 | 119 | 10$^{12}$ | 84.90 | 185 | 275 | This invention |
| 3-2 | 98 | 10$^9$ | 84.00 | 180 | 269 | This invention |
| 3-3 | 106 | 10$^7$ | 82.40 | 181 | 270 | This invention |

Example 4

Samples 4-1 to 4-4 were obtained in the same way as in Example 1 except the amount of the conductive fine particles contained in the protective layer in Sample A of Example 1 and the ratio by mass of the conductive fine particles to the binder were changed as shown in Table-5. Samples 4-1 to 4-4 each had a lattice pattern having lines 5 μm in width and spaces 295 μm in width. In the same way as Sample A of Example 1, the resultant samples were each integrated into a dispersive inorganic EL element, and then subjected to a light emission test, so as to be evaluated. The obtained results are shown in Table 4. As a result, it was understood that those samples gave luminance sufficient for practical use in the same way as in Example 1. It was understood that the panel exhibited such an excellent linearity that pen-based input data such as characters was not interrupted when the samples were each used as a transparent conductive film of a touch panel.

practical use in the same way as in Example 1. However, it was ascertained that the luminescent light-emitting luminance was lowered when the content of the conductive fine particles was small (Samples 5-18). It was further understood that the panel exhibited such an excellent linearity that pen-based input data such as characters was not interrupted when the samples were each used as a transparent conductive film of a touch panel. The evaluation of the pen-based input data was performed by evaluating the linearity by preparing a conductive film of 10 cm×10 cm in size and then applying a voltage of 5V to the film. Theses evaluations were performed on Samples 5-1 to 5-7 and Samples 5-12 to 5-16. The principle of measurement of the linearity will be explained below by taking the case where linearity of perpendicular X electrode and Y electrode is measured, as an example. When a voltage E is applied to the X electrode, the linearity can be expressed as follows:

Linearity(%)=ΔE/E×100

TABLE 5

| Sample | Conductive layer | Conductive fine particles | Layer which contains conductive fine particles | Content (g/m$^2$) | Conductive fine particles/Binder (Ratio By Mass) | Remarks |
|---|---|---|---|---|---|---|
| 4-1 | developed Ag mesh | Sb-doped tin oxide | protective layer | 0.3 | 1/1 | This invention |
| 4-2 | developed Ag mesh | Sb-doped tin oxide | protective layer | 0.3 | 1.5/1 | This invention |
| 4-3 | developed Ag mesh | Sb-doped tin oxide | protective layer | 0.4 | 1/1 | This invention |
| 4-4 | developed Ag mesh | Sb-doped tin oxide | protective layer | 0.6 | 1/1 | This invention |

Example 5

Samples 5-1 to 5-20 were obtained in the same way as in Example 1 except the amount of the conductive fine particles contained in the protective layer in Sample A of Example 1 and the ratio by mass of the conductive fine particles to the binder were changed as shown in Table-6. In this example, a thickener (sodium vinylbenzene sulfonate) was further added to the protective layer so as to adjust the viscosity of the resultant to 30 cp or more.

Samples in Table 6 each had a lattice pattern having lines 5 μm in width and spaces 295 μm in width. In the same way as Sample A of Example 1, the resultant samples were each integrated into a dispersive inorganic EL element, and then Evaluations concerning the linearity were performed according to the following procedures. First, X axis and Y axis were each divided at 10 even intervals respectively. The electric current which was applied to the X axial direction and to the Y axial direction respectively was kept constant, and the voltage at each of the measurement points was measured. Further, by connecting (X1, Y1) and (X10, Y10) by straight line, and by measuring the deviation of the voltage E from the above straight line (ΔE), the linearity of the pen-based input data was calculated using the above equation. The output of the conductive film of each of samples prepared according to the above measurement method was measured. As a result, the average of the linearity for each of the X axis and Y axis was 1%.

TABLE 6

| Sample | Content of conductive fine particles (g/m$^2$) | Conductive fine particles/ Binder (Ratio By Mass) | Surface resistivity of conductive- fine-particle- containing conductive film at mesh opening region (Ω/□) | Remarks |
| --- | --- | --- | --- | --- |
| 5-1 | 0.4 | 1.5/1 | $10^7$ | this invention |
| 5-2 | 0.4 | 1.3/1 | $10^7$ | this invention |
| 5-3 | 0.4 | 1.1/1 | $10^7$ | this invention |
| 5-4 | 0.4 | 1/1.1 | $10^7$ | this invention |
| 5-5 | 0.4 | 1/1.3 | $10^7$ | this invention |
| 5-6 | 0.4 | 1/1.5 | $10^7$ | this invention |
| 5-7 | 0.4 | 1/3 | $10^7$ | this invention |
| 5-8 | 0.4 | 1/5 | $10^8$ | this invention |
| 5-9 | 0.4 | 1/10 | $10^9$ | this invention |
| 5-10 | 0.4 | 1/20 | $10^{10}$ | this invention |
| 5-11 | 0.4 | 1/33 | $10^{12}$ | this invention |
| 5-12 | 0.6 | 1/1.1 | $10^7$ | this invention |
| 5-13 | 0.8 | 1/1.1 | $10^7$ | this invention |
| 5-14 | 0.9 | 1/1.1 | $10^6$ | this invention |
| 5-15 | 1 | 1/1.1 | $10^6$ | this invention |
| 5-16 | 0.4 | 1/1.1 | $10^8$ | this invention |
| 5-17 | 0.2 | 1/1.1 | $10^9$ | this invention |
| 5-18 | 0.05 | 1/1.1 | $10^{12}$ | this invention |
| 5-19 | 0.4 | 2.7/1 | $10^6$ | reference example |
| 5-20 | 0.6 | 4.2/1 | $10^6$ | reference example |

Example 6

Samples were each obtained in the same way as in Example 1 except the ratio by mass of the silver to the binder in the silver halide emulsion layer were changed to 1/4, 1/3, 1/2, 2/1, 3/1, and 5/1, respectively. Each of the Samples had a lattice pattern having lines 5 μm in width and spaces 295 μm in width. In the same way as Sample A of Example 1, the resultant samples were each integrated into a dispersive inorganic EL element, and then subjected to a light emission test, so as to be evaluated. As a result, it was understood that those samples gave luminance sufficient for practical use in the same way as in Example 1. It was further understood that the panel exhibited such an excellent linearity that pen-based input data such as characters was not interrupted when the samples were each used as a transparent conductive film of a touch panel.

Having described our invention as related to the present embodiments, it is our intention that the present invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2008-165603 filed in Japan on Jun. 25, 2008, and Patent Application No. 2008-322424 filed in Japan on Dec. 18, 2008, each of which is entirely herein incorporated by reference.

What is claimed is:

1. A photosensitive material for forming a conductive film, comprising:
   a support,
   a silver salt-containing emulsion layer over the support, and
   one or more optional layers formed over the support or the silver salt-containing emulsion layer side of the support,
   wherein a layer adjacent to the silver salt-containing emulsion layer contains conductive fine particles and a binder,
   wherein the ratio by mass of the conductive fine particles to the binder (the conductive fine particles/the binder) is from 1/10 to 1.5/1, and
   wherein an amount of the conductive fine particles to be painted is 0.2 g/m$^2$ or more.

2. The photosensitive material for forming a conductive film according to claim 1, wherein the ratio by mass of the conductive fine particles to the binder (the conductive fine particles/the binder) is from 1/3 to 1.5/1.

3. The photosensitive material for forming a conductive film according to claim 1, wherein an amount of the conductive fine particles to be painted is from 0.2 to 0.9 g/m$^2$.

4. The photosensitive material for forming a conductive film according to claim 3, wherein the amount of the conductive fine particles to be painted is from 0.2 to 0.4 g/m$^2$.

5. The photosensitive material for forming a conductive film according to claim 1, wherein the conductive fine particles are at least one of metal oxides selected from the group of $SnO_2$, $ZnO$, $TiO_2$, $Al_2O_2$, $In_2O_2$, $MgO$, $BaO$ and $MoO_3$; an multiple oxide thereof, or a metal oxide obtained by incorporating a different atom into the said metal oxides or multiple oxide.

6. The photosensitive material for forming a conductive film according to claim 5, wherein the conductive fine particles are fine particles of $SnO_2$ doped with antimony.

7. The photosensitive material for forming a conductive film according to claim 1, wherein when the conductive Fine particles are spherical, the average particle diameter thereof is from 0.085 to 0.12 μm, and when the conductive fine particles are in a needle form, the average axial length of their long axes (major axes) is from 0.2 to 20 μm, and the average axial length of their short axes (minor axes) is from 0.01 to 0.02 μm.

8. The photosensitive material for forming a conductive film according to claim 1, wherein an upper protective layer adjacent to the silver salt-containing emulsion layer is laid on the silver salt-containing emulsion layer side of the support, and the protective layer contains the conductive fine particles and a binder.

9. A conductive material obtained by exposing a photosensitive material for forming a conductive film according to claim 1 patternwise to light, and then subjecting the material to developing treatment.

10. The photosensitive material for forming a conductive film according to claim 1, wherein the photosensitive material forms a conductive film of an electrode of an electroluminescent (EL) element.

11. The photosensitive material for forming a conductive film according to claim 1, wherein the ratio of the conductive fine particles to the binder is 1/5 to 1.5/1.

12. The photosensitive material for forming a conductive film according to claim 1, wherein an amount of the conductive fine particles to be painted is 0.4 g/m$^2$ or more.

13. An electroluminescent (EL) element, wherein a electrode of the electroluminescent (EL) element is comprised of a conductive film of the photosensitive material according to claim 1, wherein the electrode is configured to be driven by an AC frequency of 500 Hz or more and wherein the conductive film of the electrode is 0.25 m$^2$ or more.

14. A photosensitive material for forming a conductive film comprising:
    a support,
    a silver salt-containing emulsion layer over the support, and
    one or more optional layers formed over the support or the silver salt-containing emulsion layer side of the support, wherein a layer adjacent to the silver salt-containing emulsion layer contains conductive fine particles and a binder, and wherein a content of the conductive fine particles is from 0.2 to 0.4 g/m$^2$.

15. A conductive material, comprising:

a support, a conductive layer over the support, and one or more optional layers formed over the support or the conductive layer side of the support, wherein a protective layer containing conductive fine particles and a binder is adjacent the conductive layer, wherein the ratio by mass of the conductive fine particles to the binder (the conductive fine particles/the binder) is from 1/10 to 1.5/1, and wherein an amount of the conductive fine particles is painted at 0.2 g/m$^2$ or more.

16. The conductive material according to claim 15, wherein the ratio by mass of the conductive fine particles to the binder (the conductive fine particles/the binder) is from 1/3 to 1.5/1.

17. The conductive material according to claim 15, wherein an amount of the conductive fine particles to be painted is from 0.2 to 0.9 g/m$^2$.

18. The conductive material according to claim 15, wherein a surface resistivity of the conductive layer is from 0.01Ω/☐ or more.

19. The conductive material according to claim 15, wherein, a protective layer is formed on the conductive layer, and the protective layer contains the conductive fine particles and binder, an amount of the conductive fine particles is 0.4 g/m$^2$ or more, and the layer containing the conductive fine particles and binder having a surface resistivity of 10$^7$Ω/☐ in mesh openings.

* * * * *